(12) United States Patent
Shih

(10) Patent No.: US 8,119,489 B2
(45) Date of Patent: Feb. 21, 2012

(54) METHOD OF FORMING A SHALLOW TRENCH ISOLATION STRUCTURE HAVING A POLYSILICON CAPPING LAYER

(75) Inventor: Ping-Chia Shih, Hsinchu (TW)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 360 days.

(21) Appl. No.: 12/058,183

(22) Filed: Mar. 28, 2008

(65) Prior Publication Data

US 2009/0243030 A1 Oct. 1, 2009

(51) Int. Cl.
*H01L 21/336* (2006.01)
*H01L 21/76* (2006.01)
*H01L 21/302* (2006.01)
*H01L 21/31* (2006.01)
*H01L 21/3205* (2006.01)

(52) U.S. Cl. ........ 438/295; 438/404; 438/587; 438/692; 438/764; 257/E21.546

(58) Field of Classification Search ........ 438/295, 438/404, 426, 430, 587; 257/E21.546
See application file for complete search history.

(56) References Cited

U.S. PATENT DOCUMENTS

| 5,804,490 | A | 9/1998 | Fiegl et al. | |
| 6,136,713 | A | 10/2000 | Chen et al. | |
| 6,337,255 | B1 | 1/2002 | Bradl et al. | |
| 6,475,875 | B1 * | 11/2002 | Hau et al. | 438/424 |
| 2003/0116819 | A1 * | 6/2003 | Hokazono | 257/510 |
| 2007/0072386 | A1 * | 3/2007 | Kim | 438/400 |
| 2008/0054335 | A1 * | 3/2008 | Jung | 257/315 |

OTHER PUBLICATIONS

Wook H. Lee et al., "New Floating Gate Self-Aligning Technology for Multilevel NOR Flash Memory", 2006, pp. 218-221, IEEE.

* cited by examiner

*Primary Examiner* — Kevin Parendo
(74) *Attorney, Agent, or Firm* — Winston Hsu; Scott Margo

(57) ABSTRACT

A method of fabricating an isolation structure and the structure thereof is provided. The method is compatible with the embedded memory process and provides the isolation structure with a poly cap thereon to protect the top corners of the isolation structure, without using an extra photomask.

13 Claims, 5 Drawing Sheets

METHOD OF FORMING A SHALLOW TRENCH ISOLATION STRUCTURE HAVING A POLYSILICON CAPPING LAYER

BACKGROUND OF THE INVENTION

1. Field of Invention

The present invention generally relates to a semiconductor manufacturing process. More particularly, the present invention relates to a method of forming a shallow trench isolation structure and the structure thereof.

2. Description of Related Art

Shallow trench isolation (STI) technique has been developed to avoid a bird's beak encroachment of a local oxidation of silicon (LOCOS) technique. The shallow trench isolation structure has been widely used to provide effective isolation for fabricating semiconductor devices with sub-micron or less critical dimension.

For a conventional STI process, a pad oxide layer is formed on a substrate and then a silicon nitride layer is formed on the pad oxide layer. After forming a patterned photoresist layer to define the STI region, the silicon nitride layer, the pad oxide layer and the substrate are sequentially etched to form trenches in the substrate. A silicon oxide layer is deposited over the substrate to fill the trench and followed by a planarization process to form STI structures.

However, divots or oxide loss can easily occur near the top corners of the STI structure during the subsequent etching and cleaning process steps. Charges may accumulate at the divot and result in a sub-threshold leakage current of the device in the integrated circuits. The divot or oxide loss problem becomes more serious for an embedded memory process such as embedded flash (e-flash) process due to extra etching and cleaning process steps compared to a typical logic process.

SUMMARY OF THE INVENTION

Accordingly, the present invention provides a method of forming a STI structure that can avoid the generation of the divot or oxide loss near the top corner of the trench. According to the method of this invention, the top corner of the trench is protected during the subsequent etching and cleaning process steps so that the formation of the divot is avoided.

The present invention also provides a method of forming an isolation structure and the isolation structure thereof. The isolation structure having a poly cap thereon is able to offer better isolation capability by reducing the leakage current of the device.

The invention provides a method of forming a STI structure. A substrate with a first region and a second region is provided. A pad oxide layer and a masking layer are formed in sequence over the substrate. A patterned photoresist layer on the masking layer is formed. A plurality of trenches in the substrate is formed by performing an etching process using the patterned photoresist layer as a mask. An insulation layer is formed over the substrate to fill the trenches in the substrate. A first planarization process is performed on the insulation layer until a surface of the masking layer is exposed. An etching back process is performed on the insulation layer until a surface of the insulation layer is lower than the surface of the masking layer. A polysilicon layer is formed over the substrate to cover the masking layer and the insulation layer. A second planarization process is performed on the polysilicon layer until the surface of the masking layer is exposed, so that a poly cap is formed covering a whole surface of the insulation layer in each trench and the shallow trench isolation structures according to this invention are obtained.

The poly cap formed on the insulation layer of the trench serves as a protective layer and thereby prevents occurrence of the divot or oxide loss during the subsequent etching and cleaning steps. Thus, the isolation capability of the STI structure is improved and the device performance is enhanced.

This invention also provides a semiconductor structure, including a substrate having at least a trench therein, an insulation layer filled in the trench and a first polysilicon layer disposed on the insulation layer covering at least two opposite borders of the top surface of the insulation layer. The semiconductor structure may further include a second polysilicon layer disposed above the first polysilicon layer and the substrate, and a dielectric layer disposed between the first and second polysilicon layers. The first and second polysilicon layers are respectively shaped as first and second strips, and the first and second strips are paralleled to each other.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1H' schematically illustrates a top layout view of the intermediate memory structure based on the exemplary process step of FIG. 1H according to an embodiment of this invention.

DESCRIPTION OF EMBODIMENTS

Figure 1A:
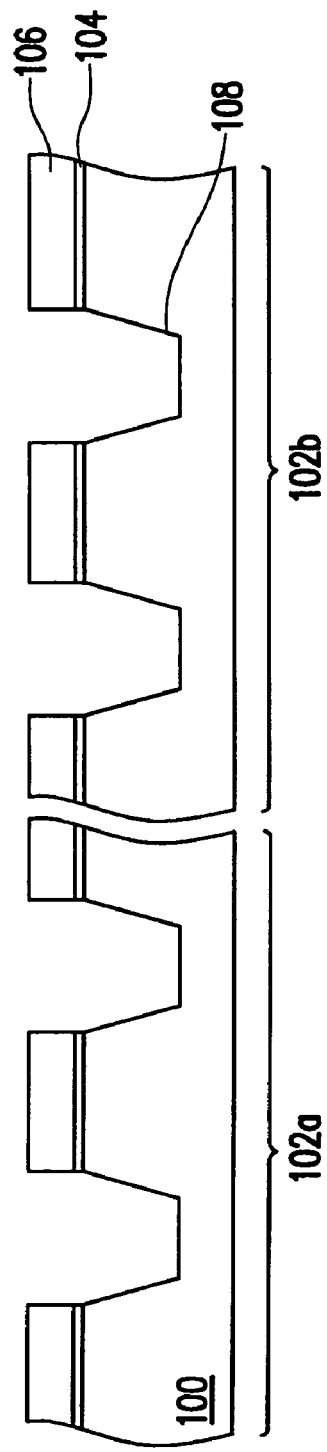
FIGS. 1A-1F are schematic cross-sectional views illustrating the process steps of forming a shallow trench isolation structure according to an embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A-1F are schematic cross-sectional views illustrating the process steps of forming a shallow trench isolation structure according to an embodiment of this invention.

Referring to FIG. 1A, a substrate 100 with a first region 102a and a second region 102b is provided. The first region 102a and the second region 102b are used for fabricating different devices, for example. In this embodiment, the first region 102a is a memory region for memory devices and the second region 102b is a logic region for logic devices. A pad oxide layer 104 is formed over the substrate 100 by, for example, a thermal oxidation process. A masking layer 106 is formed over the pad oxide layer 104 using, for example, a chemical vaporization deposition (CVD) process. The material of the masking layer 106 may include silicon nitride. A patterned photoresist layer (not shown) is formed on the making layer 106. An etching process is performed using the patterned photoresist layer as a mask to form a plurality of trenches 108 in the substrate 100. The etching process for forming the trenches 108 is, for example, reactive ion etching (RIE).

Figure 1B:
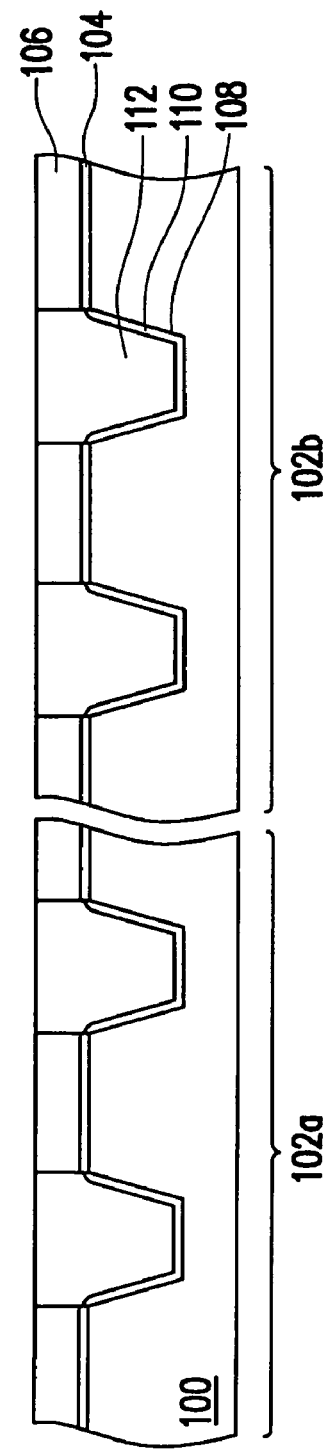

Referring to FIG. 1B, an optional liner layer 110 is formed in the trenches 108 by, for example, a thermal oxidation process. The material of the liner layer 110 may include silicon oxide. An insulation layer 112 is formed over the substrate 100, filling in the trenches 108 and covering the liner layer 110. For example, the insulation layer 112 may be a silicon oxide layer formed by high-density plasma chemical vapor deposition (HDP-CVD). A planarization process, such as chemical mechanical polishing (CMP), is performed until the surface of the masking layer 106 is exposed.

Figure 1C:
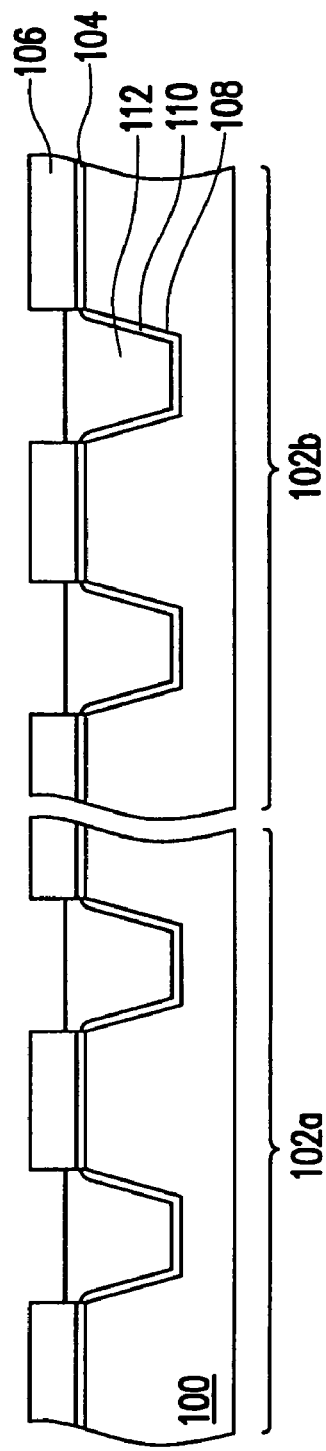

Referring to FIG. 1C, an etching back process is performed until the surface of the insulation layer 112 is lower than that of the masking layer 106. The etching back process may include a dry etching process such as RIE. The dry etching process may be operated, for example, under a time control mode (i.e. etching for a fixed period of time until a desired depth is etched). The surface of the remaining insulation layer 112 within the trenches 108 is at least coplanar with or even higher than the substrate surface.

Figure 1D:
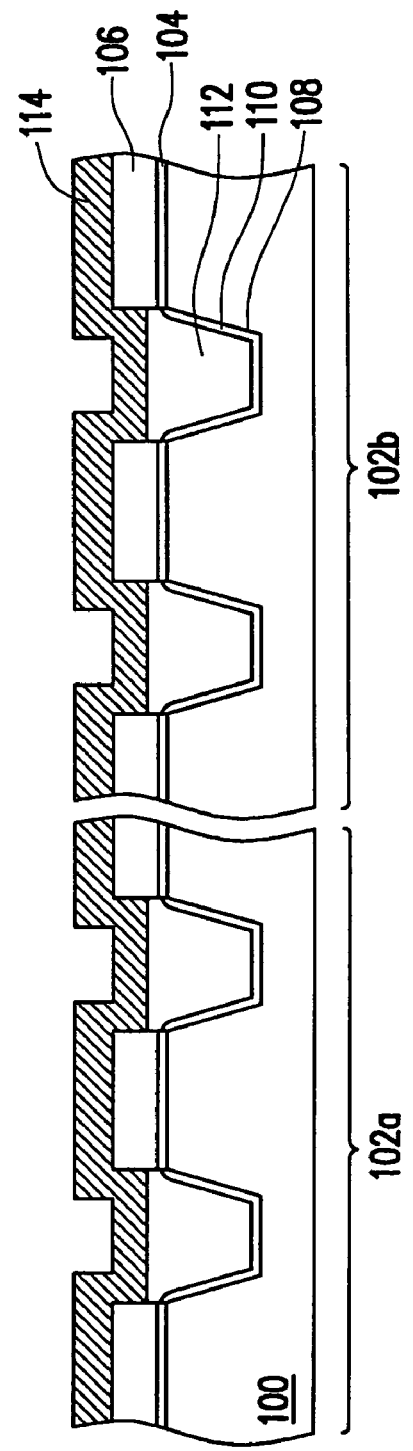
Figure 1E:
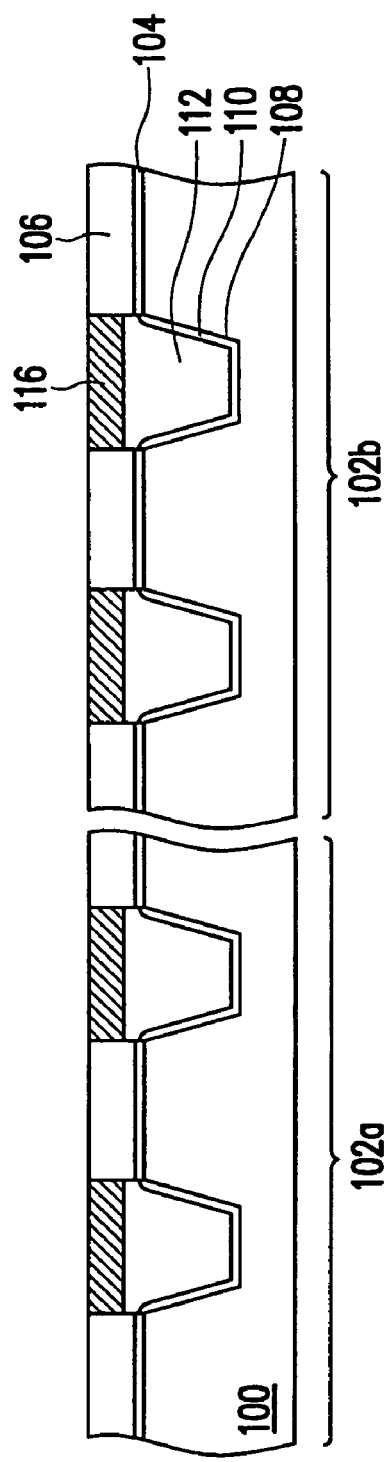

Referring to FIG. 1D, a polysilicon layer 114 is formed over the substrate 100, covering the masking layer 106 and the remaining insulation layer 112. The method of forming the polysilicon layer 114 is, for example, a CVD process. Referring to FIG. 1E, a planarization process, such as CMP, is performed to the polysilicon layer 114 until the surface of the masking layer 106 is exposed. The remaining portion of the polysilicon layer 114 forms a poly cap 116 to cover the whole surface of insulation layer 112 within each trench 108. The poly cap has a thickness of about 300 angstroms to 500 angstroms, for example.

Figure 1F:
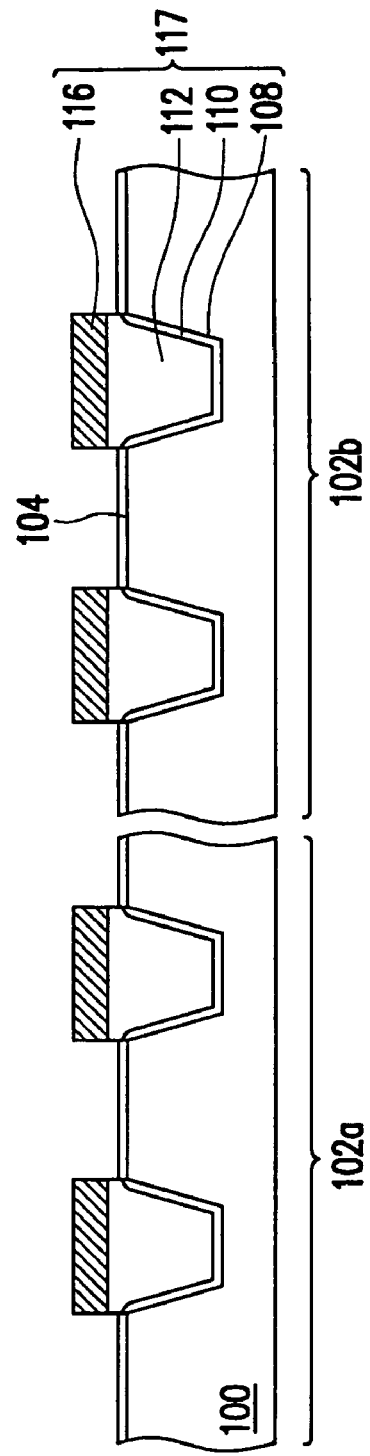

Referring to FIG. 1F, the masking layer 106 is removed by a wet etching process using hot phosphoric acid as an etchant, for example. The shallow trench isolation structure 117 includes the liner layer 110, the insulation layer 112 in the trench 108 and the poly cap 116 on the insulation layer 112.

The poly cap 116 can avoid the occurrence of a divot or oxide loss near the top corner of the trench 108 during the subsequent etching and cleaning process steps. For example, the poly cap 116 covers the surface of the insulation layer 112 of the trench 108 and thus protects the insulation layer 112 during the following etching and cleaning process steps for removing the pad oxide layer. In this case, as the corners of the trench 108 is protected by the poly cap 116, the divot issue around the top corner of the trench 108 is resolved and the leakage current or even the shortage of the device can be avoided.

Moreover, the method of the invention does not need any extra mask. Two simple process steps, depositing a polysilicon layer and performing a planarization process on the polysilicon layer, are enough to form a shallow trench structure with a poly cap thereon. In other words, the poly cap 116 of the STI structure is formed in a self-aligned way to cover at least the top corners of the STI structure.

Further, due to the etching back process performed to the insulation layer 112, the surface of the insulation layer 112 is lower than that of the masking layer 106. Therefore, the later-formed poly cap will not seriously change the topography of the STI region or area. Actually, the topography of the STI area in this invention is pretty smooth when compared with the conventional STI structure, which is beneficial for the embedded memory manufacturing process.

In this embodiment, the first region 102a is for memory devices and the second region 102b is for logic devices. According to the method described in this invention, the intermediate structure in the memory region (e.g. first region 102a) is illustrated in the below process steps.

Figure 1G:
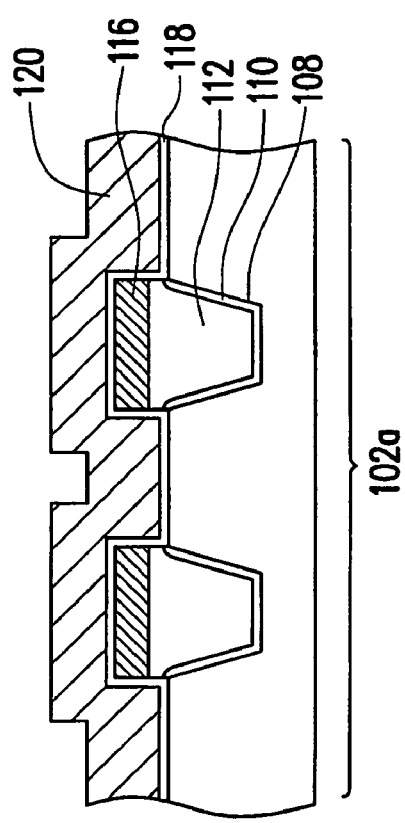
FIGS. 1G-1H are schematic cross-sectional views illustrating the exemplary process steps of forming an intermediate memory structure in the memory region according to an embodiment of this invention.
Figure 1H:
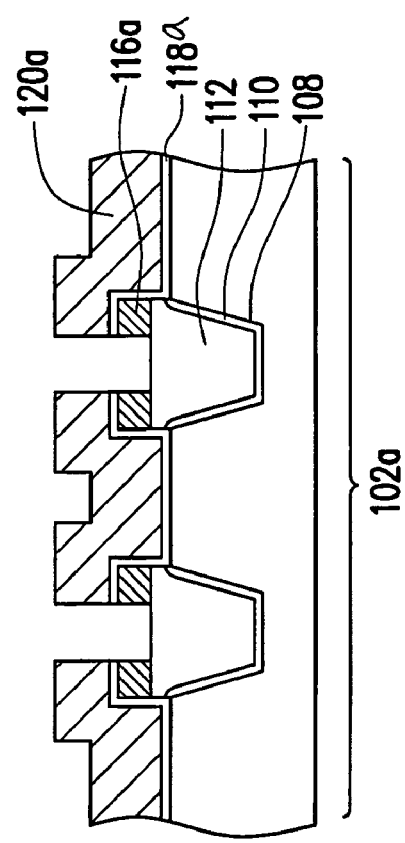
Figure 1H:
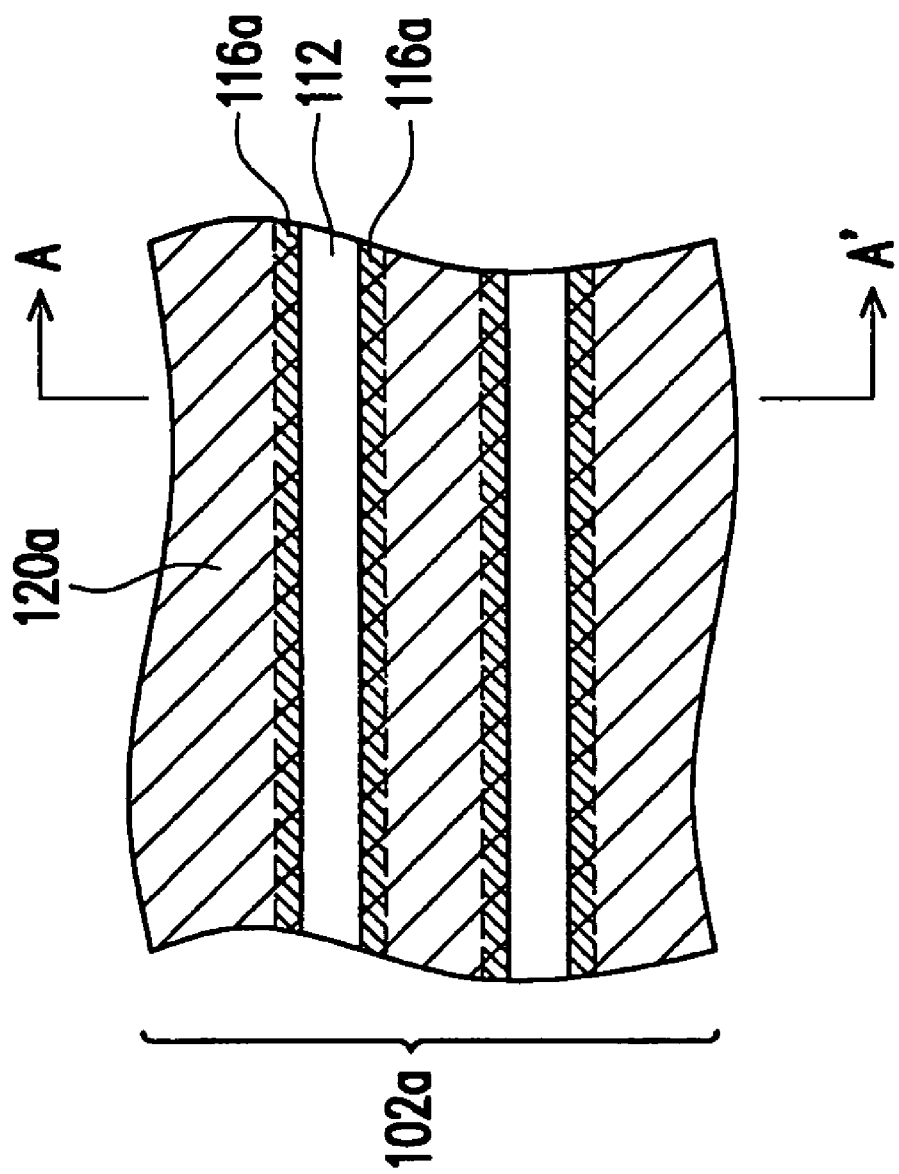

FIGS. 1G-1H are schematic cross-sectional views illustrating the exemplary process steps of forming an intermediate memory structure in the memory region according to an embodiment of this invention.

Referring to FIG. 1G, in the first region 102a, the pad oxide layer 104 (FIG. 1F) is removed, for example, by a wet etching process using fluoric acid as an etchant. A dielectric layer 118 is then conformally formed over the substrate 100 and covers the poly cap 116. The dielectric layer may be a silicon oxide layer formed by thermal oxidation, for example. A polysilicon layer 120 is formed over the substrate to cover the dielectric layer 118. The polysilicon layer 120 is formed by, for example, a CVD process.

Referring to FIG. 1H, using the floating gate mask (the mask for defining the floating gate pattern in the memory manufacturing process) as a mask, the photolithography and etching process is performed to the polysilicon layer 120 to define floating gates 120a. Using the same mask, the underlying dielectric layer 118 and the poly cap 116 are etched until the surface of the insulation layer 112 in the trench 108 is exposed, so as to form the patterned poly cap 116a and the patterned dielectric layer 118a.

FIG. 1H' schematically illustrates a top layout view of the intermediate memory structure based on the exemplary process step of FIG. 1H according to an embodiment of this invention, while FIG. 1H shows the intermediate memory structure taken along the line A-A' of FIG. 1H'.

Referring to FIGS. 1H and 1H', the poly cap 116a is disposed on the insulation layer 112, covering at least two opposite borders of the top surface of the insulation layer 112. The floating gate 120a is disposed right above the patterned poly cap 116a with the patterned dielectric layer 118a located between the poly cap 116a and the floating gate 120a. The patterned poly cap 116a and the floating gate 122a are respectively shaped as strips paralleled to each other.

The following memory processes in the first region 102a and the logic processes in the second region 102b will not be described in details as these process steps are known to persons skilled in the arts.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a shallow trench isolation (STI) structure, the method comprising:
   providing a substrate;
   forming a masking layer over the substrate;
   patterning the masking layer;
   forming a plurality of trenches in the substrate;
   forming an insulation layer over the substrate to fill the plurality of trenches in the substrate;
   performing a first planarization process to the insulation layer until a surface of the masking layer is exposed;
   after performing the first planarization process performing an etching back process to the planarized insulation layer, so that a surface of the planarized insulation layer is lower than a surface of the masking layer but higher than a substrate surface;
   forming a polysilicon layer over the substrate to cover the patterned masking layer and the insulation layer;
   after forming the polysilicon layer performing a second planarization process to the polysilicon layer until the surface of the patterned masking layer is exposed for forming a polysilicon cap so that the polysilicon cap is disposed to cover a whole surface of the insulation layer in each of the plurality of trenches; and removing the patterned masking layer.

2. The method of claim 1, wherein a material of the masking layer comprises silicon nitride.

3. The method of claim 1, wherein a material of the insulation layer comprises silicon oxide.

4. The method of claim 1, wherein performing the first planarization process to the insulation layer comprises a chemical mechanical polishing (CMP) process.

5. The method of claim 1, wherein the etching back process is performed for a fixed period of time until a desired depth is etched.

6. The method of claim 1, wherein the step of performing the etching back process to the insulation layer comprises performing a reactive ion etching (RIE) process.

7. The method of claim 1, further comprising forming a liner layer over a surface of the plurality of trenches before forming the insulation layer.

8. The method of claim 1, wherein performing the second planarization process to the polysilicon layer comprises a chemical mechanical polishing (CMP) process.

9. The method of claim 1, wherein the polysilicon cap has a thickness in a range of about 300 Angstroms to 500 Angstroms.

10. The method of claim 1, wherein the substrate comprises a first region and a second region, and the first region is a memory region and the second region is a logic region.

11. The method of claim 10, further comprising:
forming a pad oxide layer before the forming of the masking layer; and;
patterning the pad oxide layer.

12. The method of claim 11, further comprising:
removing the pad oxide layer in the first region after forming the polysilicon cap;
forming a dielectric layer over the first region of the substrate to cover the polysilicon cap;
forming a second polysilicon layer over the first region of the substrate to cover the dielectric layer; and
patterning the second polysilicon layer to form a plurality of floating gates in the first region and patterning the dielectric layer and polysilicon layer in the first region.

13. The method of claim 1, further comprising forming the plurality of trenches in the substrate by performing an etching process using the patterned masking layer as a mask.

* * * * *